US009063604B2

(12) United States Patent
Zhou

(10) Patent No.: US 9,063,604 B2
(45) Date of Patent: Jun. 23, 2015

(54) TOUCH SCREEN AND MANUFACTURING METHOD THEREOF

(71) Applicant: NANCHANG O-FILM TECH. CO., LTD., Nanchang, Jiangxi (CN)

(72) Inventor: Fei Zhou, Nanchang (CN)

(73) Assignee: NANCHANG O-FILM TECH. CO., LTD., Jiangxi (CN)

( * ) Notice: Subject to any disclaimer, the term of this patent is extended or adjusted under 35 U.S.C. 154(b) by 0 days.

(21) Appl. No.: 14/000,199

(22) PCT Filed: Jul. 6, 2013

(86) PCT No.: PCT/CN2013/078942
§ 371 (c)(1),
(2) Date: Sep. 25, 2014

(87) PCT Pub. No.: WO2014/146382
PCT Pub. Date: Sep. 25, 2014

(65) Prior Publication Data
US 2015/0009420 A1 Jan. 8, 2015

(30) Foreign Application Priority Data
Mar. 20, 2013 (CN) .......................... 2013 1 0090345

(51) Int. Cl.
*G06F 3/045* (2006.01)
*G06F 3/041* (2006.01)
(Continued)

(52) U.S. Cl.
CPC ............... *G06F 3/0412* (2013.01); *G06F 3/044* (2013.01); *H05K 1/0306* (2013.01); *H05K 1/09* (2013.01);
(Continued)

(58) Field of Classification Search
CPC ................. G06F 2203/04103; G06F 3/044
USPC .......... 345/173, 174; 178/18.01, 18.03, 18.06
See application file for complete search history.

(56) References Cited

U.S. PATENT DOCUMENTS

| 7,479,319 | B2 * | 1/2009 | Hirano et al. ................. 428/141 |
| 2005/0073507 | A1 * | 4/2005 | Richter et al. ................ 345/174 |

(Continued)

FOREIGN PATENT DOCUMENTS

| CN | 101497992 A | 8/2009 |
| CN | 102216891 A | 10/2011 |
| CN | 102722279 A | 10/2012 |

OTHER PUBLICATIONS

Office Action dated Jan. 10, 2014 for corresponding Chinese Application No. 20130090345.6.

*Primary Examiner* — Koosha Sharifi-Tafreshi
(74) *Attorney, Agent, or Firm* — Haynes Beffel & Wolfeld LLP

(57) ABSTRACT

A touch screen manufacturing method includes the following steps: providing a glass substrate; bombarding a surface of the glass substrate by plasma to expose Si—O-groups on the surface; coating and curing a jell on the surface of the glass substrate which is bombarded by plasma, forming a base material layer, the jell is bonded to the Si—O-groups on the glass substrate during curing; embossing the base material layer by embossing mold, forming a trench on the surface of the base material layer against the glass substrate; and filling metal into the trench, and forming metal mesh as a conductive layer. A touch screen is also disclosed. Compared to the traditional process using ITO as a conductive layer, mesh shape can be one-step formed, the process is simple, and the yield rate is high. And the cost is greatly reduced using metal instead of ITO, since not etching process is used, conductive material will not be wasted, and it reduces heavy metal emission in the waste.

23 Claims, 15 Drawing Sheets

(51) Int. Cl.
*G06F 3/044* (2006.01)
*H05K 1/03* (2006.01)
*H05K 1/09* (2006.01)
*H05K 3/00* (2006.01)

(52) U.S. Cl.
CPC .......... *H05K 3/00* (2013.01); *H05K 2201/0326* (2013.01); *H05K 2201/10128* (2013.01); *H05K 2201/10151* (2013.01)

(56) References Cited

U.S. PATENT DOCUMENTS

| | | | |
|---|---|---|---|
| 2009/0096759 A1* | 4/2009 | Nishiwaki et al. | 345/173 |
| 2010/0238133 A1* | 9/2010 | Wu et al. | 345/174 |
| 2010/0309162 A1* | 12/2010 | Nakanishi et al. | 345/174 |
| 2012/0234663 A1* | 9/2012 | Hwang et al. | 200/600 |
| 2012/0327021 A1* | 12/2012 | Ryu et al. | 345/174 |
| 2014/0062908 A1* | 3/2014 | Ra | 345/173 |

* cited by examiner

TOUCH SCREEN AND MANUFACTURING METHOD THEREOF

FIELD OF THE INVENTION

The present invention relates to touch screens, and relates to a touch screen manufacturing method.

BACKGROUND OF THE INVENTION

Touch screen is a touch induction device which can receive input signal. Touch screen gives a new appearance to information exchange, it is a new attractive information interactive device. The development of the touch screen technology causes a widespread concern of the domestic and foreign information media; it becomes a new rising high-tech force in the photoelectric industry.

At present, ITO (indium-tin oxide) layer is a crucially important part of touch screen module. Although the touch screen manufacturing technology develops rapidly, the projected capacitive screen for example, the basic manufacturing processes of ITO layer as a capacitance induction conductive layer does not change too much in recent years, which always requires ITO coating, ITO graphic inevitably.

The traditional manufacturing method uses etching process inevitably, a large number of ITO and metal materials will be wasted.

SUMMARY OF THE INVENTION

Based on this, it is necessary to provide a touch screen manufacturing method which can save the conductive layer material.

A method of manufacturing a touch screen comprises: providing a glass substrate; bombarding a surface of the glass substrate by plasma, to expose Si—O-groups on the surface; coating and curing a jell on the surface of the glass substrate which is bombarded by plasma, forming a base material layer, the jell is bonded to the Si—O-groups on the glass substrate during curing; embossing the base material layer by embossing mold, forming a trench on the surface of the base material layer against the glass substrate; and filling metal into the trench, and forming metal mesh as a conductive layer.

In one embodiment, the surface of the glass substrate which is bombarded by plasma has a roughness of 5-10 nm A touch screen comprises a glass substrate, a conductive layer, and a base material layer, wherein one surface of the glass substrate forms Si—O-groups by plasma bombardment procedure, the base material layer is disposed on the surface and is bonded to the Si—O-groups, the base material layer is formed by curing a jell, the base material layer defines a trench on a side thereof away from the glass substrate, the conductive layer is located in the trench, the conductive layer is a mesh composed of metal wires, the mesh comprises a plurality of mesh cells, the mesh cell comprises a plurality of mesh edges and nodes formed by connecting two adjacent edges, the conductive layer comprises a sensing region and a wire region electrically connected to the sensing region, the sensing region comprises a plurality of first sensing patterns and a plurality of second sensing patterns, the first sensing pattern and the second sensing pattern is adjacent and electrically insulated from each other, the mesh cells in each first sensing pattern are electrically connected with each other, the mesh cells in each second sensing pattern are electrically connected with each other.

In one embodiment, the surface of the glass substrate which is bombarded by plasma has a roughness of 5-10 nm In one embodiment, the first sensing pattern comprises a first main line extending along a second axis of a two-dimensional coordinate and a plurality of first side shoots extending laterally along the first main line, the second sensing pattern comprises a second main line extending along the second axis of the two-dimensional coordinate and a plurality of second side shoots extending laterally along the second main line, each second main line has a mutual interval between head and end, the first side shoot and the second side shoot are arranged alternately with intervals.

In one embodiment, the first side shoot and the second side shoot extend along a first axis of the two-dimensional coordinate, the first side main line and the second main line are parallel.

In one embodiment, the conductive layer further comprises a color matching line which forms complementary pattern with the sensing region and the wire region, the sensing region and the wire region are electrically insulated.

In one embodiment, the color matching line forms a mesh, the mesh cell of the mesh formed by the color matching line has the same shape and length edge as the mesh cell of the mesh of the first sensing pattern and the second sensing pattern.

In one embodiment, the color matching line between the adjacent first sensing pattern and second sensing pattern loses a mesh edge meeting the insulated track.

In one embodiment, the color matching line between the adjacent first sensing pattern and second sensing pattern is disconnected from the middle of the mesh edge.

In one embodiment, the color matching line between the adjacent first sensing pattern and second sensing pattern is disconnected from the node of the mesh where the first sensing pattern and the second sensing pattern are adjacent.

In one embodiment, the wire region comprises a plurality of wire clusters, the wire clusters are insulated to each other, each wire cluster is formed by single column mesh cells connected to each other, one end of each wire cluster is electrically connected to one of the second sensing pattern.

In one embodiment, each wire cluster has two common nodes with the second sensing pattern.

In one embodiment, part of wire clusters comprise a trunk portion, adjacent mesh cells in the trunk portion are connected to each other by one common node.

In one embodiment, the some wire clusters further comprise a branch portion connected to the trunk portion, adjacent mesh cells in the branch portion connect each other by one common mesh edge, the adjacent mesh cells comprises two common nodes, a mesh cell on one end of the branch portion connects to a mesh cell on one end of the trunk portion by a common mesh edge.

In one embodiment, the color matching line between the trunk portion of the adjacent two wire clusters is disconnected from the middle of the mesh edge.

In one embodiment, the disconnection has a length of 2-20 μm.

In one embodiment, the disconnection has a length of 3-9 μm.

In one embodiment, the trunk portion is disconnected from the node where the mesh is adjacent to the color matching line.

In one embodiment, the adjacent mesh cells of the portion of the some wire clusters are connected to each other by a common mesh edge, the adjacent two mesh cells comprises two common nodes.

In one embodiment, the mesh cell of the mesh is a diamond.

In one embodiment, the sensing region comprises a left sensing region and a right sensing region, which are mutually separated, each left sensing region and right sensing region comprises a plurality of first sensing patterns and a plurality of second sensing patterns, the wire region is disposed between the left sensing region and the right sensing region.

In one embodiment, the trench is formed by embossing of an embossing mold with a preset protrusion.

In one embodiment, the trench has a depth-to-width ratio of more than 1.

In one embodiment, the trench has a depth no less than the thickness of the conductive layer.

In one embodiment, the thickness of the base material layer is less than that of the glass substrate.

In one embodiment, it further comprises a protective layer, the protective layer covers the base material layer and the conductive layer.

The touch screen manufacturing method and the touch screen above, use embossing process of manufacturing, compared to the traditional process which uses ITO as a conductive layer, mesh shape can be one-step formed, the process is simple, and the yield rate is high. And the material cost is greatly reduced using metal instead of ITO, since not etching process is used, the conductive material will not be wasted, and it reduces heavy metal emission in the waste.

DETAILED DESCRIPTION OF THE EMBODIMENTS

Figure 1:
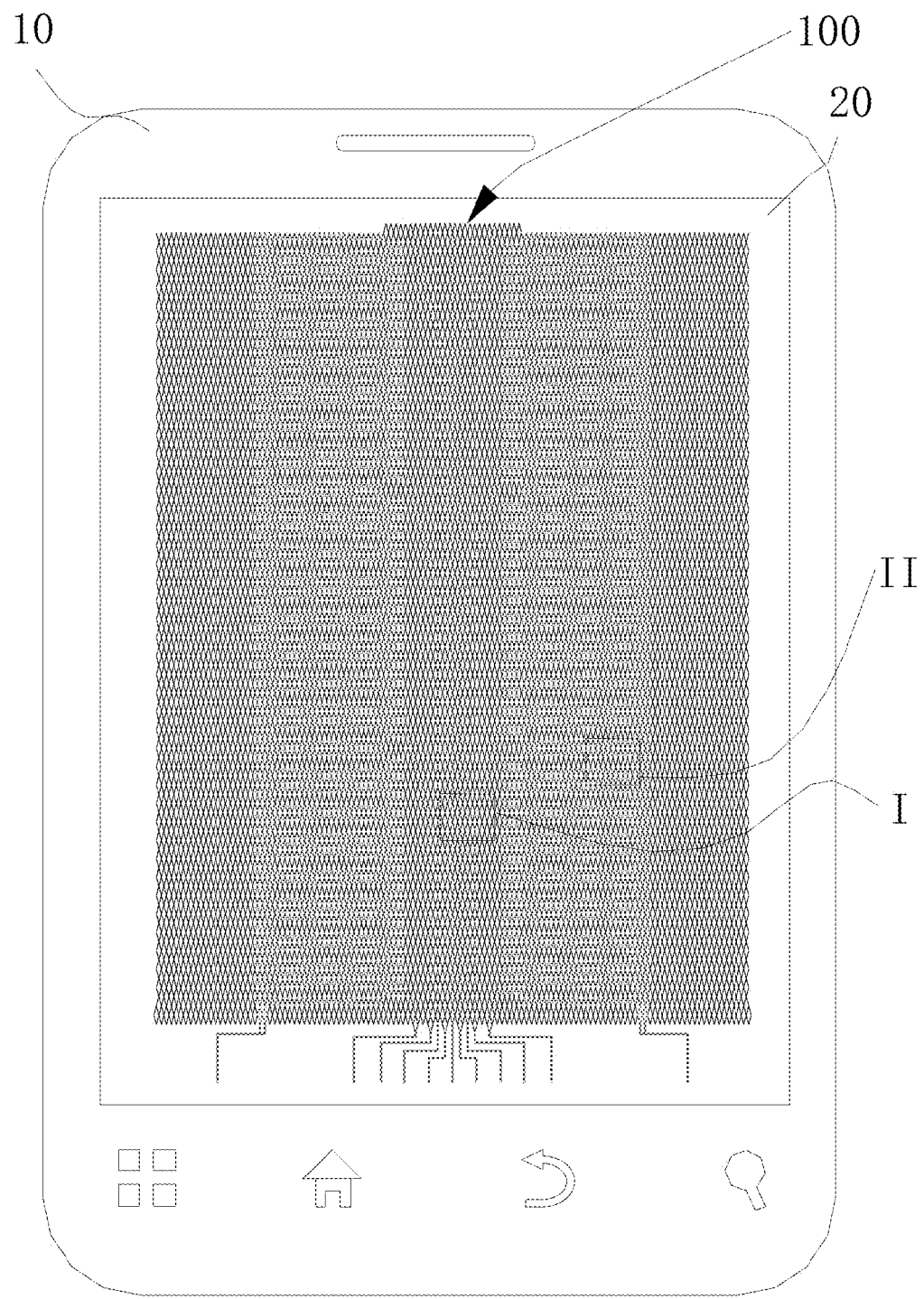
FIG. 1 is a schematic of a touch screen in one embodiment

The invention will be described in detail with the drawings, for easy understanding. The preferred embodiment of the present invention is given in the drawings. However, the present invention can be implemented in different ways, not limited to the embodiments described here. On the contrary, the object of providing these embodiments is to make the content of the invention disclosed more thoroughly and comprehensively.

That is, when a component is called "fixed" on another component, it can directly on another component or there can exist component between them. When an component is considered to be "connected" to another component, it can be directly connected to another component or there may exist component between them at the same time. In this paper, the use of the term "vertical", "horizontal", "up", "down", "left", "right", "horizontal", "vertical" and similar expressions are for illustration purposes only.

Unless otherwise defined, the technical and scientific terms used in this paper has the same meaning as the commonly understood of those skilled in the art. The object of the terms used in the specification of the present invention in this paper is for describing the specific embodiments, instead of limiting the present invention. The term "and/or" used in this paper includes the one or more related items' combinations.

Figure 2:
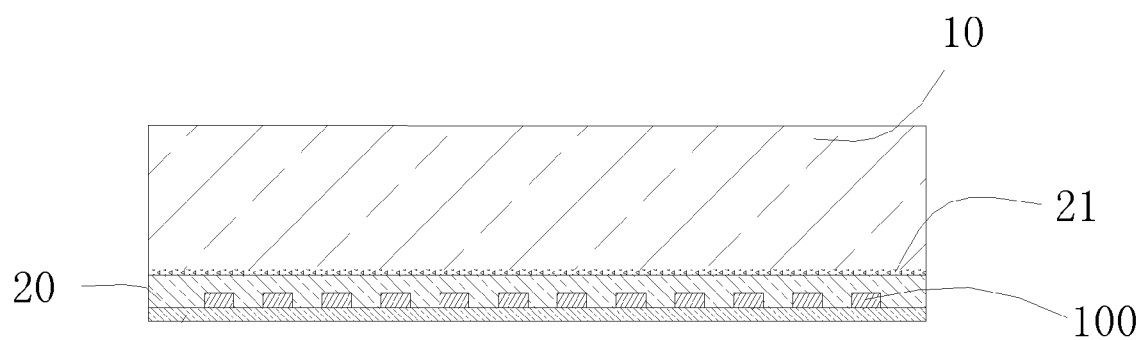
FIG. 2 is a cross-sectional view of FIG. 1.

FIG. 1 is a schematic of a touch screen in one embodiment, FIG. 2 is a sectional view of the touch screen, the touch screen comprises a glass substrate 10, a conductive layer 100, and a base material layer 20.

The glass substrate 10 is a calcium silicate glass or an aluminosilicate glass, the glass substrate 10 comprises a bonding surface 21 which is bonded to the base material layer 20, the bonding surface 21 exposes Si—O-groups by plasma bombardment procedure, the bonding surface 21 has a roughness of 5-10 nm.

The base material layer 20 is disposed on the bonding surface 21, the base material layer 20 is formed by curing a jell, the thickness of which is less than that of the glass substrate 10. When curing, the free radical of the jell is bonded to the Si—O-groups, for tightly integration of the base material layer 20 and the glass substrate 10.

In this embodiment, the jell which forms the base material layer 20 is solvent-free UV curing acrylic resin. In other embodiments, the jell which forms the base material layer 20 can be other photo curable, thermosetting adhesive and self adhesive. Wherein the photo curable is a combination of prepolymer, monomer, photo initiator and additives in accordance with the molar ratio: 30~50%, 40~60%, 1~6% and 0.2~1% wherein the prepolymer is at least one of epoxy acrylate, polyurethane, polyether acrylates, polyester acrylate and acrylic resin; the monomer is at least one of monofunctional (e.g. IBOA, IBOMA, HEMA and etc), double-functional (e.g. TPGDA, HDDA, DEGDA, NPGDA and etc), triple-functional (e.g. TMPTA, PETA and etc); the photo initiator is benzophenone, desoxybenzoin and etc. More specially, auxiliaries with a molar ratio of 0.2~1% can be added into the combination above. The auxiliaries can be hydroquinone, methoxy phenol, benzoquinone, 2, 6 Di tert butyl phenol and etc.

Figure 11A:
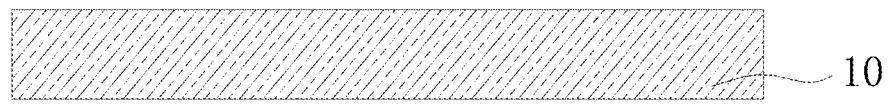
FIGS. 11A-11E are cross-sectional views of touch screen in manufacturing.
Figure 11B:
Figure 11C:
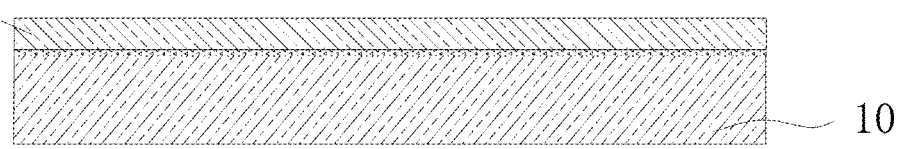
Figure 11D:
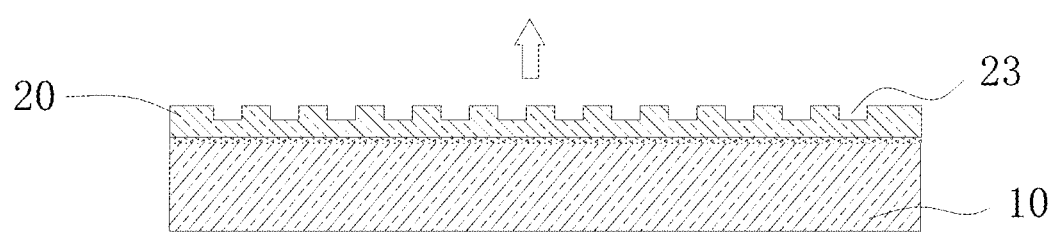

Referring to FIG. 11D, the base material layer 20 defines a trench 23, the trench 23 is formed by embossing of an embossing mold with a preset protrusion, metal wires is contained in the trench 23. The trench 23 has a depth-to-width ratio of more than 1. The trench 23 has a depth no less than the thickness of the conductive layer, therefore the base material layer 20 can protect the conductive layer 100.

The metal of the conductive layer 100 is a pure metal or alloy of any two or more than two of gold, silver, copper, aluminum, nickel and zinc.

The conductive layer 100 is a mesh composed of metal wires, the mesh comprises a plurality of mesh cells, the mesh cell comprises a plurality of mesh edges and nodes formed by connecting two adjacent edges. In this embodiment, each mesh cell of the mesh is a diamond, in other embodiments, the mesh cell can be other shapes, for example, rectangle, triangle and etc.

The conductive layer 100 comprises a sensing region 110 and a wire region 120 electrically connected to the sensing region.

In this embodiment, to reduce the color difference and get better display effect, the conductive layer 100 further comprises a color matching line which forms complementary pattern with the sensing region 110 and the wire region 120, the color matching line is electrically insulated with the sensing region 110 and the wire region 120, in other embodiment, the color matching line can be omitted. In this embodiment, the mesh cell of the sensing region 110, the wire region 120 and the color matching line has the same shape and period, in other embodiment, it can be different, for example, the color matching line can be a zigzag or a broken line.

Figure 3A:
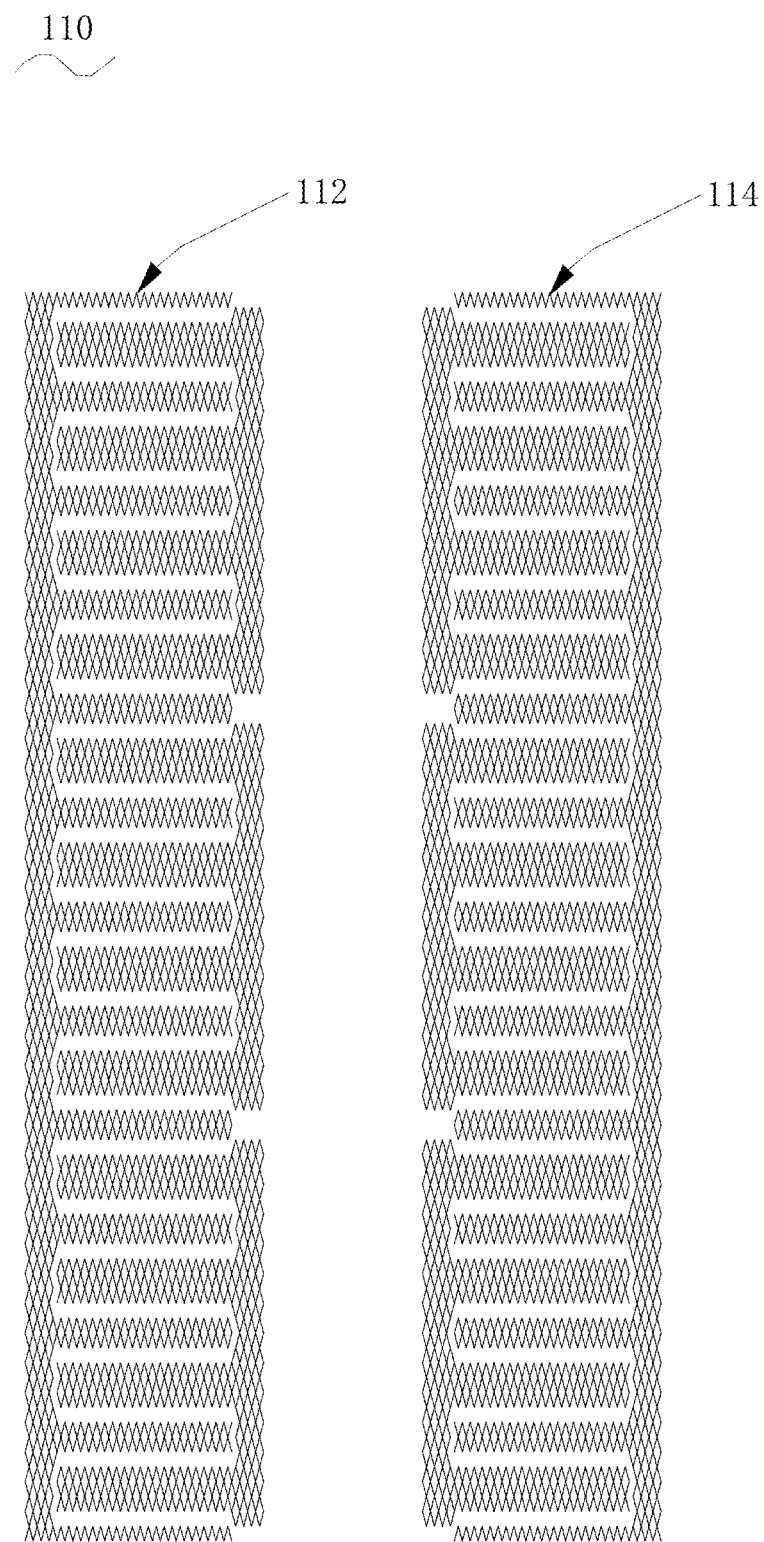
FIG. 3A is a schematic structure of a sensing region.

The conductive layer 100 in FIG. 1 is axisymmetric, the conductive layer 100 is axisymmetric with one of the perpendicular bisector, in other embodiment, the conductive layer 100 can be any other structure instead of axisymmetric. Also referring to FIG. 3B, the sensing region 110 comprises at least one of first sensing patterns 111 and at least one of second sensing patterns 113, the first sensing pattern 111 and the second sensing pattern 113 is adjacent and electrically insulated from each other, the mesh cells in each first sensing pattern 111 are electrically connected with each other, the mesh cells in each second sensing pattern 113 are electrically connected with each other. Also referring to FIG. 3A, in this embodiment, the sensing region 110 comprises a left sensing region 112 and a right sensing region 114, which are mutually separated, because of the axisymmetric conductive layer 100, the left sensing region 112 and the right sensing region 114 are axisymmetric, each left sensing region 112 and each right sensing region 114 comprises at least one of first sensing pattern 111 and at least one of second sensing patter 113.

Figure 3B:
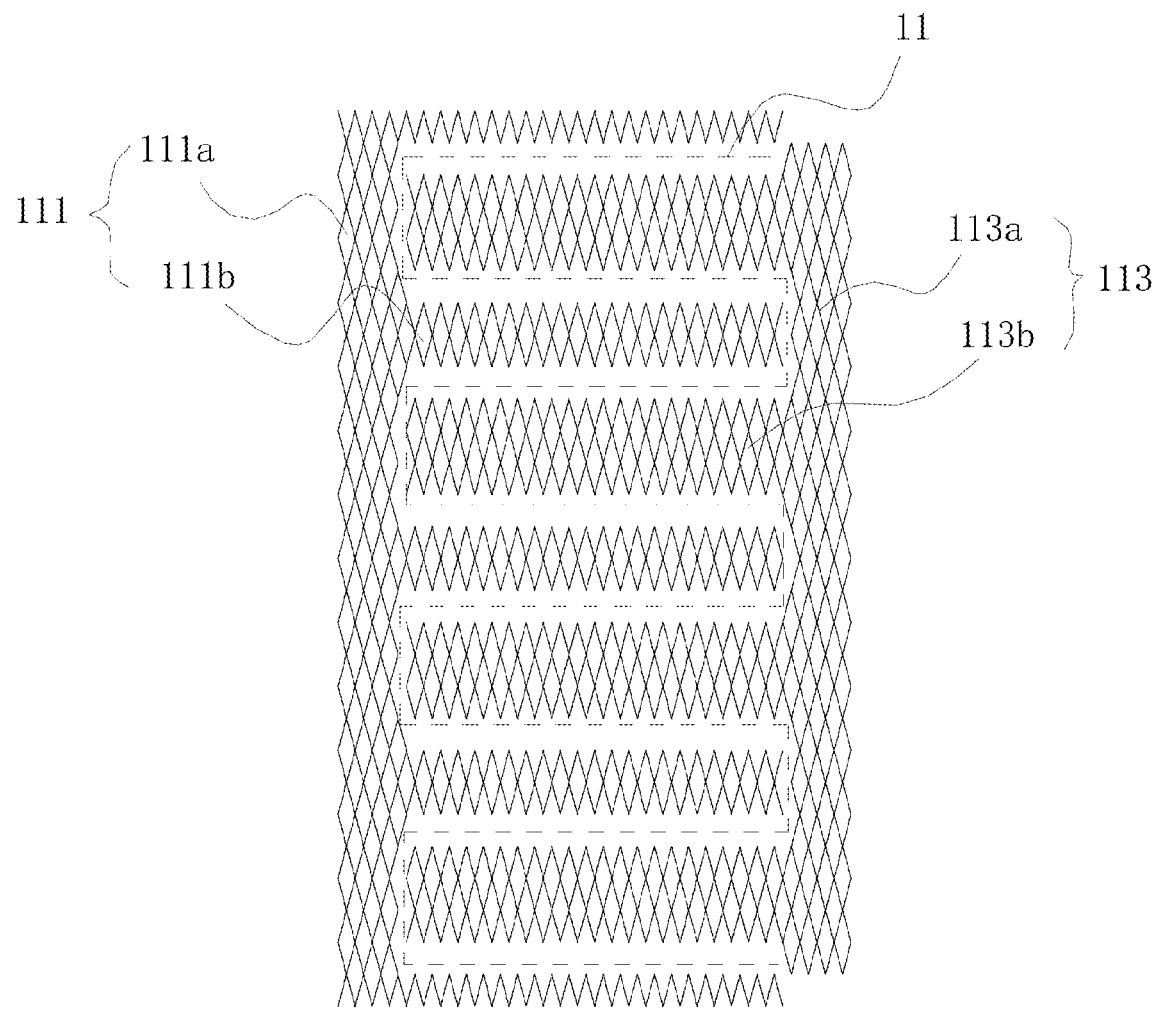
FIG. 3B illustrates first and second sensing patterns of the sensing region of FIG. 3A.

Referring to FIG. 3B, the first sensing pattern 111 comprises a first main line 111a extending along a second axis of a two-dimensional coordinate and a plurality of first side shoots 111b extending laterally along the first main line 111a, the second sensing pattern 113 comprises a second main line 113a extending along the second axis of the two-dimensional coordinate and a plurality of second side shoots 113b extending laterally along the second main line 113a, each second main line 113a has a mutual interval between head and end, the first side shoot 111b and the second side shoot 113b are arranged alternately with intervals, which forms mutual inductance between the second sensing pattern 113 and the first sensing pattern 111. The first side shoot 111b and the second side shoot 113b extend along a first axis of the two-dimensional coordinate department, the first side main line 111a and the second main line 113a are parallel.

In the detail embodiment in the drawings, the two-dimensional coordinate department is XOY rectangular coordinate system, the first axis is X axis, the second axis is Y axis. In other embodiment, the two-dimensional coordinate department can be any other coordinate system, e.g. a two-dimensional oblique coordinate system.

Figure 4A:
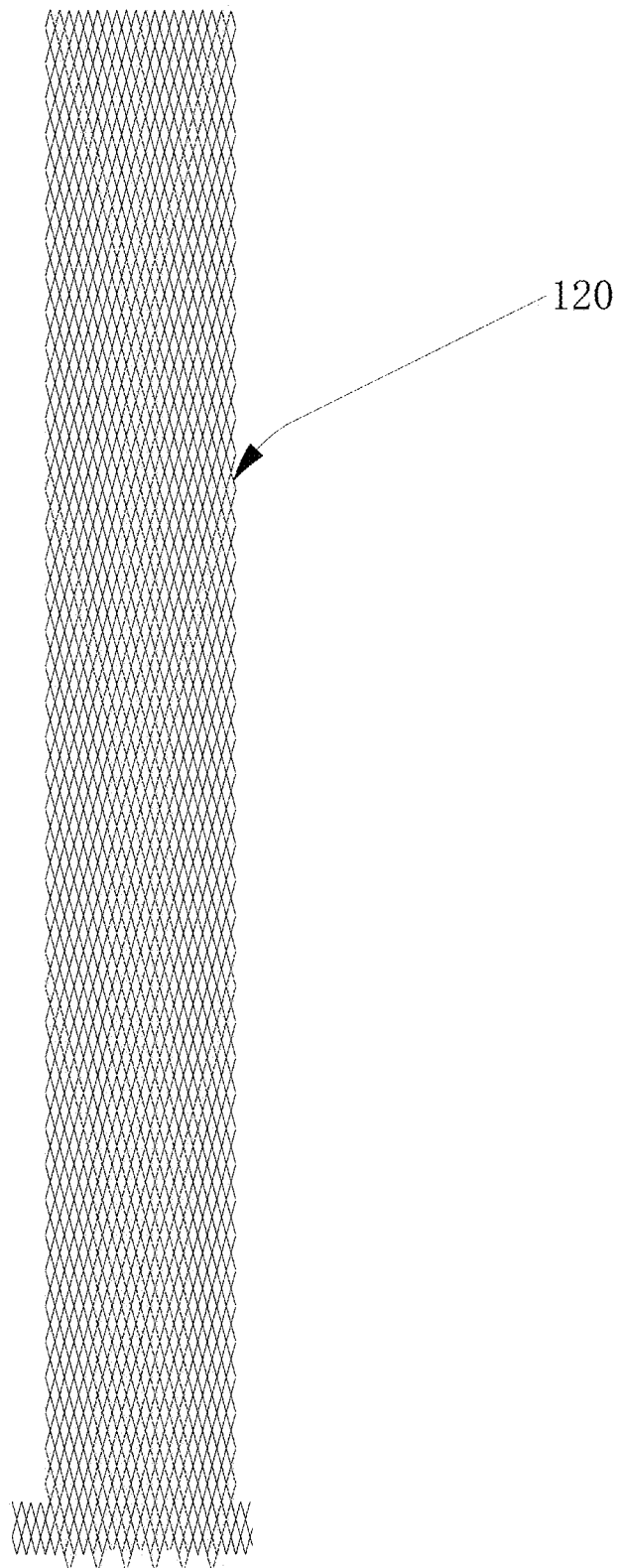
FIG. 4A is a schematic structure of a wire region and a color matching line in the wire region and the sensing region.
Figure 4B:
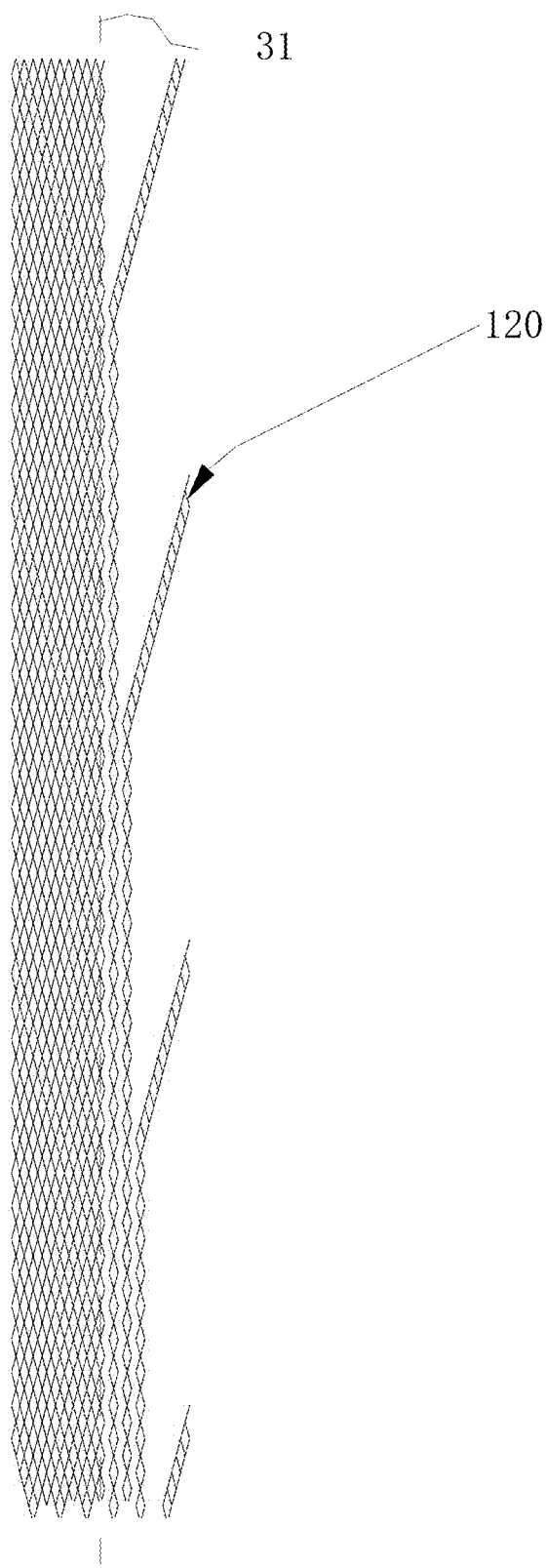
FIG. 4B is a schematic of FIG. 4A without the color matching line right to the symmetry axis.

The wire region 120 is disposed between the left sensing region 112 and the right sensing region 114. FIG. 4A illustrates the wire region 120 and the color matching line structure between the wire region 120 and the sensing region 110. For easy distinguishing of the wire region 120 and the color matching line beside, FIG. 4B omits the color matching line right to the symmetry axis, and keeps the color matching line left to the symmetry axis.

The wire region 120 comprises a plurality of wire clusters as the number of the second sensing pattern, each wire cluster is connected to the second sensing pattern 113 correspondingly, each wire cluster is insulated to each other.

Figure 5:
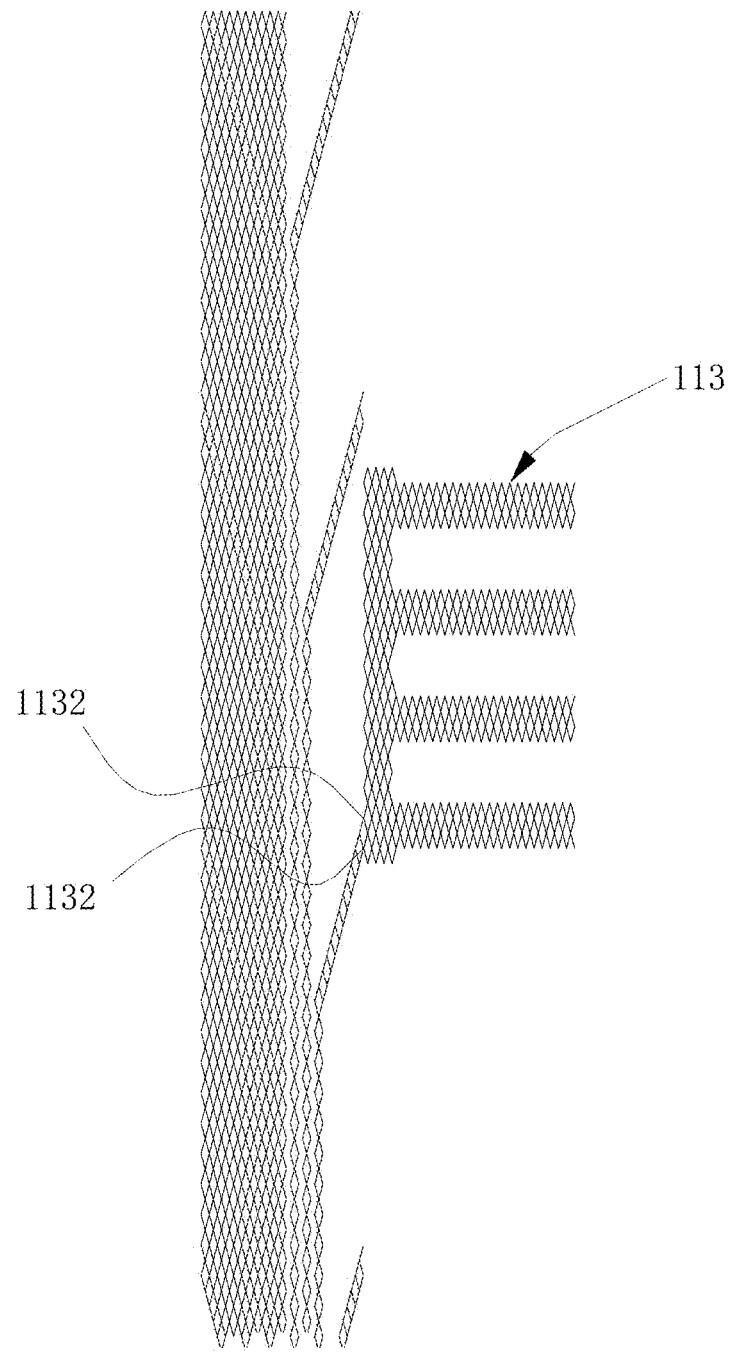
FIG. 5 is a schematic of the wire cluster which is connected to the second sensing pattern in FIG. 4B.

The wire clusters are distributed beside the second sensing pattern 113, one end of each wire cluster is electrically connected to one of the second sensing pattern 113, the other end extends to the edge of a inner side of the base material layer 20. In this embodiment, each wire cluster is formed by single column mesh cells connected to each other, the position of the wire clusters is the blind zone of touching on the touch screen, these single disposed wire structures reduce the area of the blind zone of touching, and improve the touch sensitivity of the touch screen. Referring to FIG. 5, each wire cluster has two common nodes 1132 with the second sensing pattern 113.

Figure 6A:
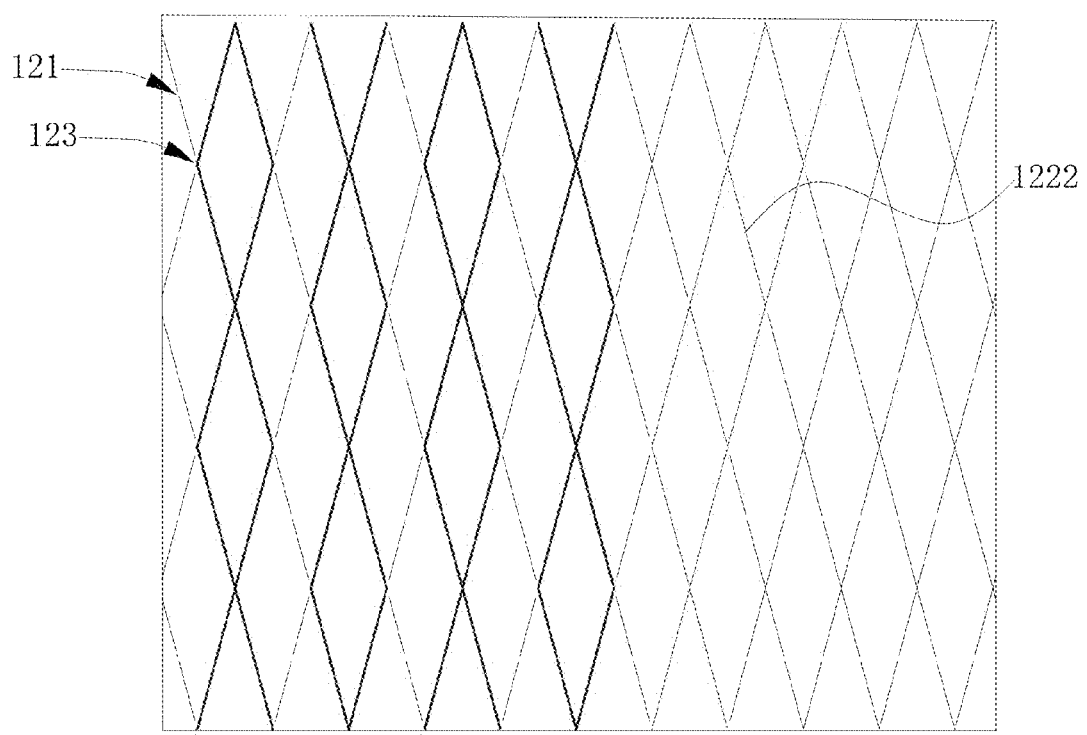
FIG. 6A is a partial enlarged drawing of zone 1 in FIG. 1.
Figure 6B:
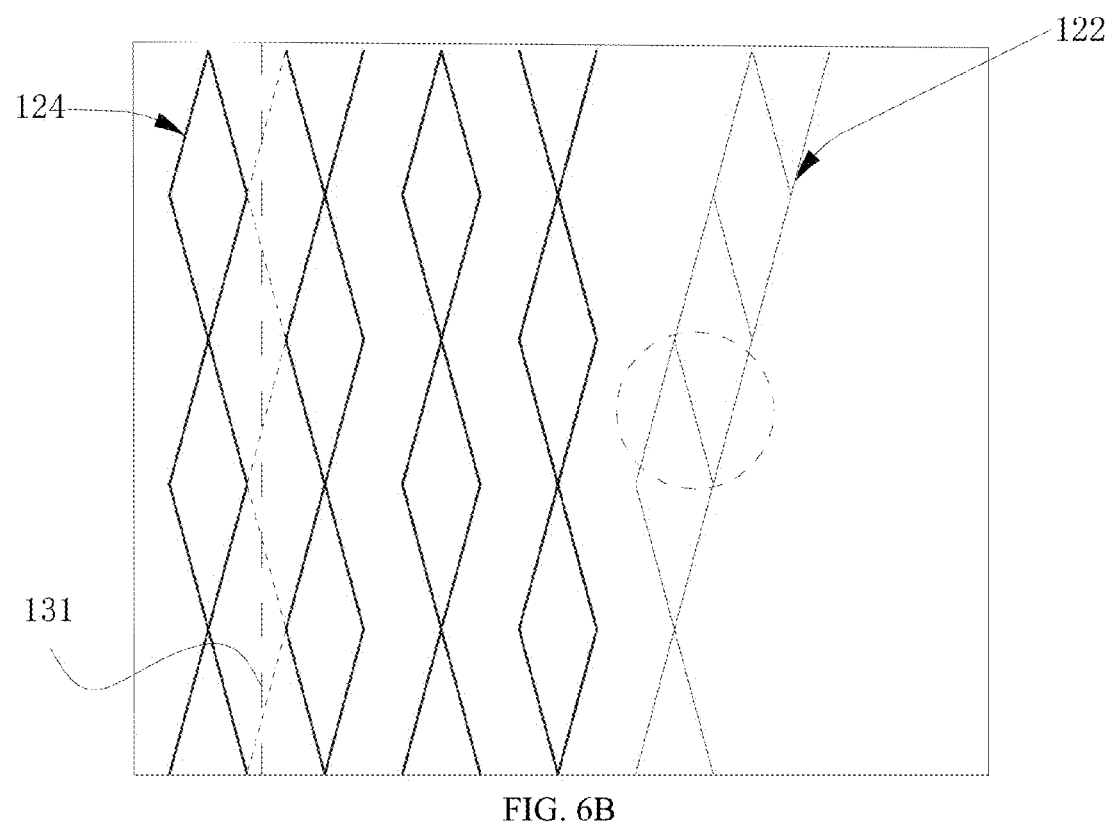
FIG. 6B is a schematic of FIG. 6A without the color matching line.

FIG. 6A is a partial enlarged drawing of zone 1 in FIG. 1, FIG. 6B is a schematic of FIG. 6A without the color matching line. Also referring to FIG. 6A and FIG. 6B, each wire cluster comprises a branch portion 122 though which connected to the second sensing pattern 113. Adjacent mesh cells in the branch portion 122 are connected to each other by one common mesh edge 1222, and the adjacent mesh cells comprise two common nodes. In this embodiment, the wire cluster 122 further comprises a trunk portion 124, the trunk portion 124 of each wire cluster is parallel, the branch portion 122 is connected to the edge of the conductive layer 100 though the trunk portion 124, then to the PCB though the wire, and transfers signals produced by the capacitance change by the sensing region 110 to the PCB plate. Adjacent mesh cells in each trunk portion 124 are connected to each other by one common node. A mesh cell on one end of the branch portion 122 connects to a mesh cell on one end of the trunk portion 124 by a common mesh edge, the common mesh edge is marked with a broken line in FIG. 6B.

The main function of the trunk portion 124 is to lead the branch portion to the lower edge of the conductive layer 100, therefore the second sensing pattern 113 near the low edge of the conductive layer 100 can be led to the edge of the conductive layer 100 by the branch portion 122, which means the corresponding wire cluster does not comprise the trunk portion 124, Adjacent mesh cells in the wire cluster are connected to each other by one common mesh edge, and the adjacent mesh cells comprise two common nodes.

The two diagonals of the mesh cell with a shape of diamond extend along the X axis and the Y axis of the two-dimensional rectangular coordinate system respectively, the trunk portion 124 extends along the Y axis. Referring to the drawings, the wire region 120 is also axisymmetric, the wire cluster left to the symmetry axis is connected to the left sensing region 112, the wire cluster right to the symmetry axis is connected to the right sensing region 114.

As mentioned, the conductive layer 100 further comprises the color matching line. According to the working principle of the touch screen, each first sensing pattern 111 and second sensing patter 113 are insulation with each other as well as each wire cluster, therefore the present invention implements the insulation by disconnecting the color matching line.

More specially, the present invention provides a plurality of disconnecting means, the following drawings illustrate the structure schematic of the color matching line which implements the insulation of the wire cluster:

(1) one column of the color matching line between the trunk portions 124 of the adjacent two wire clusters is removed. Referring to FIG. 6B, this is equivalent to losing a mesh edge meeting the first line 131, the first line 131 is a virtual line extending along an axis parallel to the trunk portion 124, in other words along the Y axis. The disconnected structure is equivalent to losing a plurality of mesh edges on the basis of the original mesh, without changing the mesh period, and therefore it will not lead to large color difference during the touch screen displaying.

Figure 7:
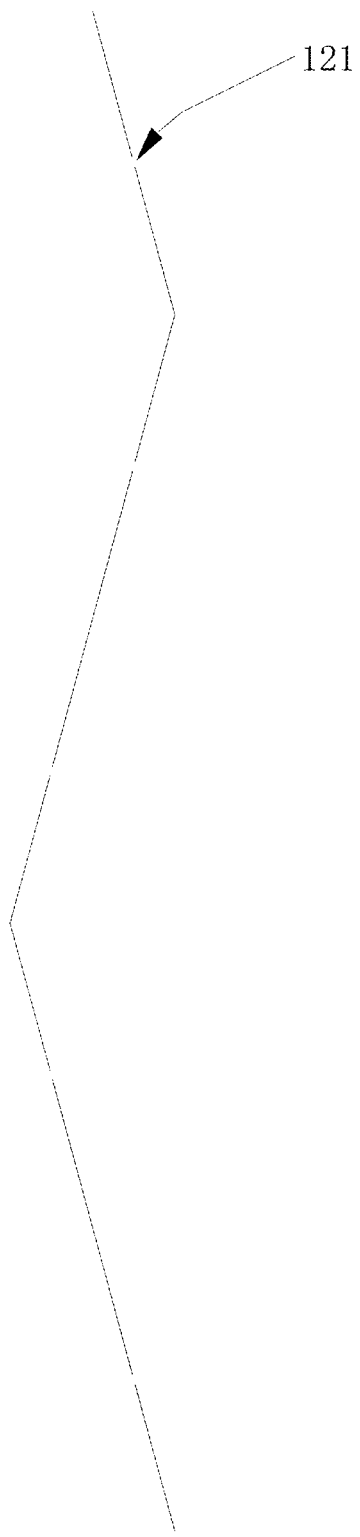
FIG. 7 is a insulation structure schematic of the color matching line which implements the wire cluster insulation in one embodiment.

(2) the color matching line between the trunk portions 124 of the adjacent two wire clusters is disconnected from the middle of the mesh edge. Referring to FIG. 7, the disconnection part forms port 121, the disconnection has a length of 2-20 μm, a better disconnection has a length of 3-9 μm, in one preferred embodiment, the disconnection has a length of 6 μm. If the interval between the trunk portions 124 of the adjacent two wire clusters is wide, and comprises a plurality columns of the color matching line, it is unnecessary to disconnect each mesh edge of the color matching line in theory, for example only one column of the color matching line (e.g. which meets the first line 131) is disconnected. Considering the situation of the designed disconnection part is adhesion because of a bad job during the manufacturing process, more color matching lines can be designed to be disconnected, for example, each mesh edge of the color matching line of the trunk portions 124 of the adjacent wire clusters is disconnected in the middle, to ensure insulation.

Figure 8:
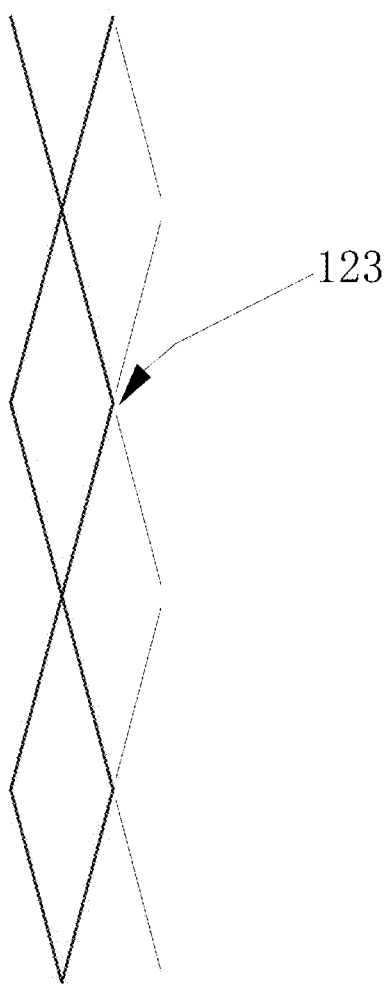
FIG. 8 is a insulation structure schematic of the color matching line which implements the wire cluster insulation in another embodiment.

(3) The trunk portion 124 is disconnected from the node of the adjacent mesh cell with the adjacent color matching line. Referring to FIG. 8, it is disconnected on the mesh cell 123. It is understandable that each trunk portion 124 Of the clusters can implement insulation when disconnected from the adjacent color matching line on left or right on the node of the mesh cell, but in order to ensure insulation when adhesion occurs during the manufacturing process, the left and the right node of the trunk portion 124 can both be disconnected.

The embodiment in FIG. 6A is a combination of (2) and (3), the trunk portion 124 is disconnected from the adjacent color matching line on the adjacent mesh cell node 123, the mesh edge between the disconnected mesh cell node 123 is disconnected in the middle and forms the port 121.

The insulation structure (2), (3) and the insulation structure of the embodiment in FIG. 6A, due to the disconnection part size can be ignored if compared to the mesh edges, it can further reduce color difference.

Figure 9A:
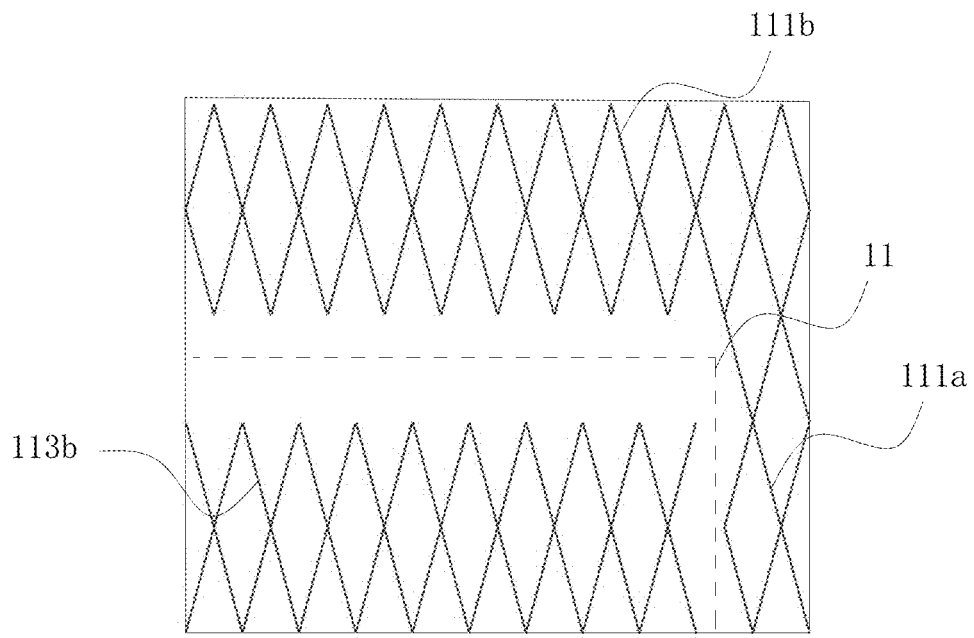
FIG. 9A-9D are insulation structure schematics of the color matching line which implements the first sensing pattern and the second sensing pattern insulation respectively.

The following introduces the insulation structure which implements the color matching line insulation between the first sensing pattern 111 and the second sensing pattern 113:

(4) the color matching line between the adjacent first sensing pattern 111 and second sensing pattern 113 loses a mesh edge meeting the insulated track. Referring to FIG. 9A, FIG. 9A is an insulation structure schematic of the color matching line which implements insulation by disconnection of one embodiment, the position above the conductive layer 100 corresponds to the zone II in FIG. 1. The insulation track 11 is a line (it also may be a broken line or a curve) in the gap between the adjacent first sensing pattern 111 and the second sensing patter 113, for easy understanding, FIG. 3B also illustrates the insulation track 11. The insulation track is a broken line of this embodiment, comprising the part extending along the X axis and another part extending along the Y axis. In the embodiment of FIG. 9A, the color matching line between the first sensing pattern 111 and the second sensing pattern 113 is single-row/column structure, therefore all of the color matching lines between the first sensing pattern 111 and the second sensing pattern 113 are lost. The insulation structure (4) is equivalent to losing a plurality of mesh edges on the basis of the original mesh, without changing the mesh period, and therefore it will not lead to large color difference during the touch screen displaying.

Figure 9B:
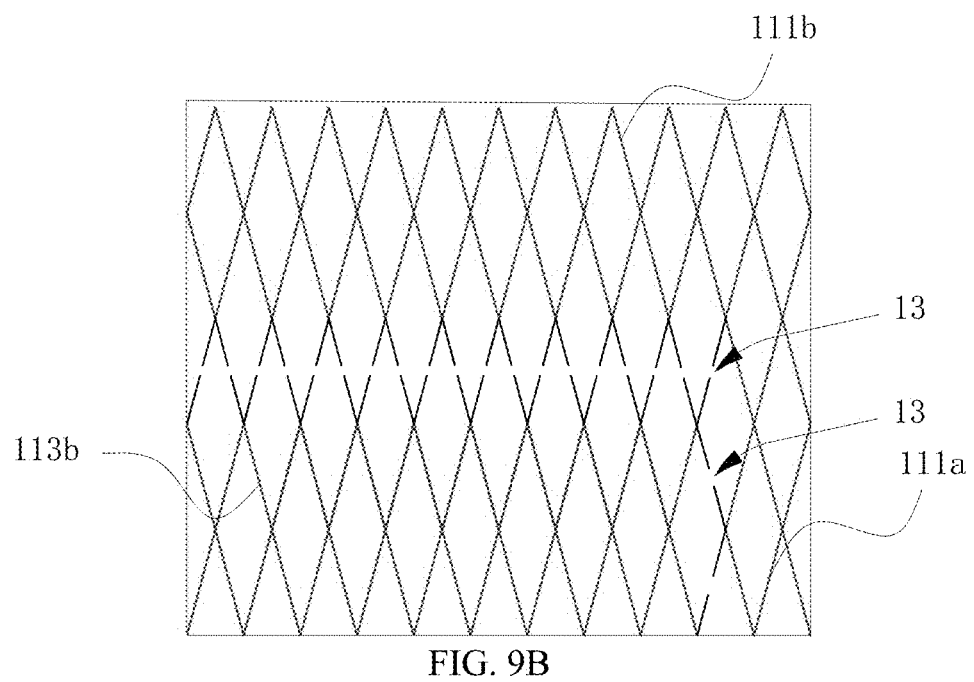

(5) the color matching line between the adjacent first sensing pattern 111 and second sensing pattern 113 is disconnected from the middle of the mesh edge. Referring to FIG. 9B, the disconnection part forms port 13, the disconnection has a length of 2-20 μm, a better disconnection has a length of 3-9 μm, in one preferred embodiment, the disconnection has a length of 6 μm. If the interval between the adjacent first sensing pattern 111 and the second sensing pattern 113 is wide, and there comprises a plurality rows/columns of the color matching line, it is unnecessary to disconnect each mesh edge of the color matching line in theory, for example only one row/column of the color matching line (e.g. the color matching line meeting the insulation track) is disconnected. Considering the situation of the designed disconnection part is adhesion because of a bad job during the manufacturing process, more color matching lines can be designed to be disconnected, for example, each mesh edge of the color matching line of the adjacent first sensing pattern 111 and the second sensing pattern 113 is disconnected in the middle, to ensure insulation.

Figure 9C:
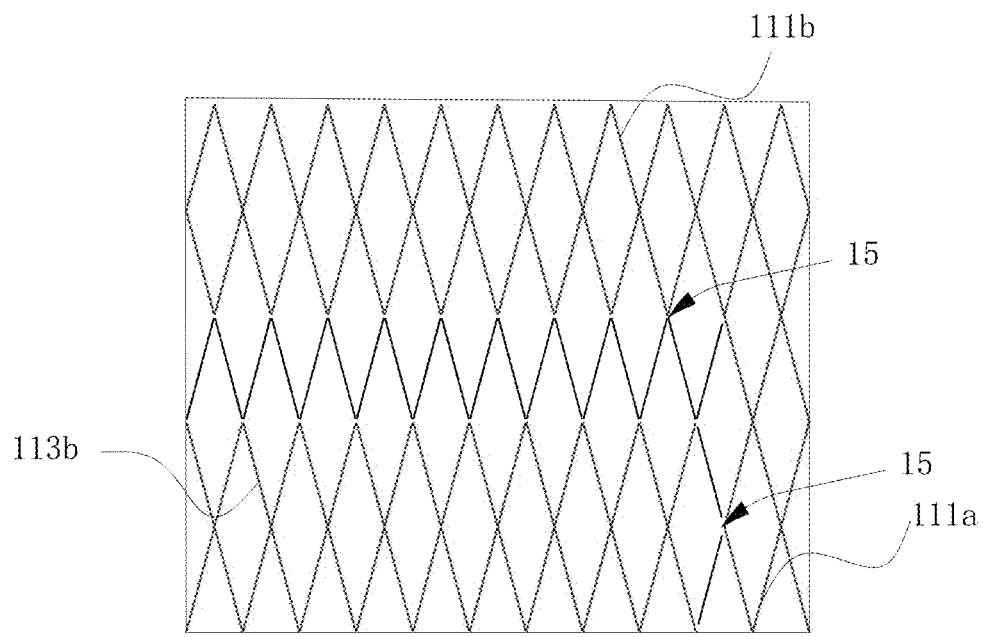

The color matching line between the adjacent first sensing pattern 111 and second sensing pattern 113 is disconnected from the middle of the mesh node where the first sensing pattern 111 and the second sensing pattern is adjacent. Referring to FIG. 9C, it is disconnected from the mesh node 15. It is understandable that the color matching line between the adjacent first sensing pattern 111 and the second sensing pattern 113 only need to be disconnected from the mesh node where it is adjacent to the first sensing pattern 111, or where it is adjacent to the second sensing pattern 113, and it implements insulation, considering the situation of the designed disconnection part is adhesion because of a bad job during the manufacturing process, the color matching line can be disconnected from both the nodes where it is adjacent to the first sensing pattern 111 and the second sensing pattern 113.

Figure 9D:
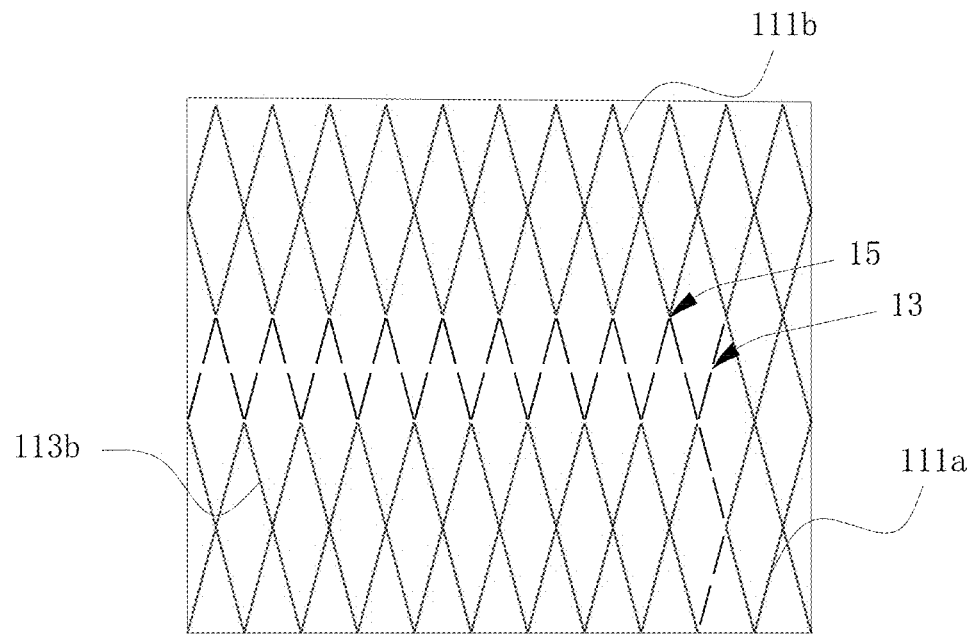

In the embodiment of FIG. 1, the (5) and (6) means are combined, referring to FIG. 9D, the color matching line between the adjacent first sensing pattern 111 and second sensing pattern 113 is disconnected from the mesh node 15 where it is adjacent to the first sensing pattern 111 and the second sensing pattern 113, the mesh edge between the disconnected mesh node 15 is disconnected from the middle and forms port 13.

The insulation structure (5), (6) above and the insulation structure of the embodiment in FIG. 9D, due to the disconnection part size can be ignored if compared to the mesh edges, it can further reduce color difference.

The conductive layer has a structure of metal mesh, which can be manufactured by embossing process, compared to the traditional process which uses ITO as a conductive layer, mesh shape can be one-step formed, the process is simple, the yield rate is high. And the material cost is greatly reduced using ITO instead of metal, because of not using etching process, conductive material will not be wasted, and it reduces heavy metal emission in the waste liquid.

Referring to FIG. 2, the touch screen further comprises a protective layer 30, the protective layer 30 covers the base material layer 20 and the conductive layer 100.

Figure 10:
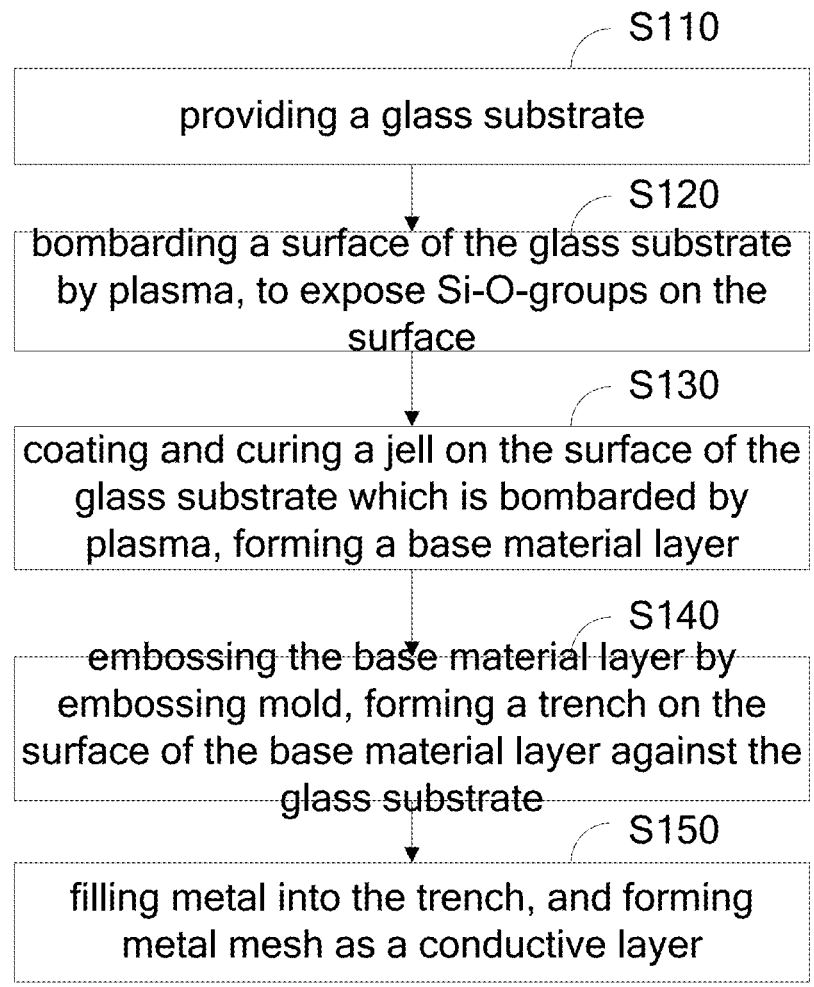
FIG. 10 is a schematic of touch screen manufacturing method in one embodiment.

Referring to FIG. 10, the present invention further provides a manufacturing method of a touch screen, comprising following steps:

S110, providing a glass substrate.

Providing a glass substrate as shown in FIG. 11A, the glass substrate 10 is a calcium silicate glass or an aluminosilicate glass.

S120, bombarding a surface of the glass substrate by plasma, to expose Si—O-groups on the surface.

Referring to FIG. 11B, in the embodiment, plasma 63 is used to bombard the surface of the glass substrate 10, and forms the bonding surface 21. Plasma cleansing machine can be used, the preferred roughness is 5-10 nm. The main function of the plasma bombardment process is to clean the glass surface and expose Si—O-groups (Si—O—Si→Si—O—).

Because glass is polar luminescence material, while the base material layer 20 is non-polar luminescence material, the adhesion between the glass substrate 10 and the base material layer 20 is limited without the process, and the adhesive will move during stripping. After the process, the bonding surface 21 exposes Si—O-groups, it will help to bond to the base material layer 20, and increase the adhesion between the glass substrate 10 and the base material layer 20.

S130, coating and curing a jell on the surface of the glass substrate which is bombarded by plasma, forming a base material layer.

Referring to FIG. 11C, the base material layer is a embossing adhesive, the material is PMMA or photo curable. In the embodiment, the base material layer 20 is solvent-free UV curing acrylic resin. In other embodiment, the jell which forms the base material layer 20 can be other photo curable, thermosetting adhesive and self adhesive. Wherein the photo curable is a combination of prepolymer, monomer, photo initiator and additives in accordance with the molar ratio: 30~50%, 40~60%, 1~6% and 0.2~1% wherein the prepolymer is at least one of epoxy acrylate, polyurethane, polyether acrylates, polyester acrylate and acrylic resin; the monomer is at least one of monofunctional (e.g. IBOA, IBOMA, HEMA and etc), double-functional (e.g. TPGDA, HDDA, DEGDA, NPGDA and etc), triple-functional (e.g. TMPTA, PETA and etc); the photo initiator is benzophenone, desoxybenzoin and etc. More specially, auxiliaries with a molar ratio of 0.2~1% can be added into the combination above. The auxiliaries can be hydroquinone, methoxy phenol, benzoquinone, 2, 6 Di tert butyl phenol and etc.

S140, embossing the base material layer by embossing mold 61, forming a trench on the surface of the base material layer against the glass substrate.

Referring to FIG. 11D, the base material layer 20 is embossing adhesive, embossed by an embossing mold with a preset protrusion, it forms the trench 23. In the embodiment, the trench 23 has a depth of 3 μm, a width of 2.2 μm. In other embodiment, the size of the trench can be changed according to the actual need.

S150, filling metal into the trench, and forming metal mesh as a conductive layer.

Figure 11E:
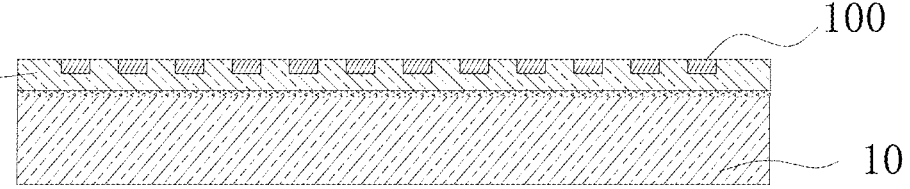

Referring to FIG. 11E, the conductive layer 100 can use the conductive structure of the touch screen as mentioned. The metal of the conductive layer 100 is a pure metal or alloy of any two or more than two of gold, silver, copper, aluminum, nickel and zinc. Scraping technique can be used to fill the trench 23 with nano silver ink, and then sintering at 150° C., the Ag in nano silver ink will be sintered into a conductive wire. Wherein the silver ink solid has a content of 35%, solvent volatilizes in sintering process.

The embodiments above only disclose a plurality of embodiments of the present invention, the description is specific and detailed, but not limit the scope of the present invention patent. It should be noted that, those skilled in the art, within the premise of the conception of the present invention, also can make a plurality of deformation and improvements, all these belong to the scope of protection of the present invention. Therefore, the protection range of the present invention based on the appended claims.

What is claimed is:

1. A touch screen, comprising a glass substrate, a conductive layer, and a base material layer, wherein one surface of the glass substrate forms Si—O-groups by a plasma bombardment procedure, the base material layer is disposed on the surface and is bonded to the Si—O-groups, the base material layer is formed by curing a jell, the base material layer defines a trench on a side thereof away from the glass substrate, the conductive layer is located in the trench, the conductive layer is a mesh composed of metal wires, the mesh comprises a plurality of mesh cells, the mesh cell comprises a plurality of mesh edges and nodes formed by connecting two adjacent edges, the conductive layer comprises a sensing region and a wire region electrically connected to the sensing region, the sensing region comprises a plurality of first sensing patterns and a plurality of second sensing patterns, the first sensing pattern and the second sensing pattern is adjacent and electrically insulated from each other, the mesh cells in each first sensing pattern are electrically connected with each other, the mesh cells in each second sensing pattern are electrically connected with each other, the conductive layer further comprising a color matching line which forms complementary pattern with the sensing region and the wire region, the sensing region and the wire region being electrically insulated, the color matching line forming a second mesh, the second mesh forming a second mesh cell having the same shape and length edge as the mesh cell of the mesh of the first sensing pattern and the second sensing pattern.

2. The touch screen of claim 1, wherein the surface of the glass substrate which is bombarded by plasma has a roughness of 5-10 nm.

3. The touch screen of claim 1, wherein the first sensing pattern comprises a first main line extending along a second axis of a two-dimensional coordinate and a plurality of first side shoots extending laterally along the first main line, the second sensing pattern comprises a second main line extending along the second axis of the two-dimensional coordinate and a plurality of second side shoots extending laterally along the second main line, each second main line has a mutual interval between head and end, the first side shoot and the second side shoot are arranged alternately with intervals.

4. The touch screen of claim 3, wherein the first side shoot and the second side shoot extend along a first axis of the two-dimensional coordinate, the first side main line and the second main line are parallel.

5. The touch screen of claim 1, wherein the color matching line between the adjacent first sensing pattern and second sensing pattern loses a mesh edge meeting the insulated track.

6. The touch screen of claim 1, wherein the color matching line between the adjacent first sensing pattern and second sensing pattern is disconnected from the middle of the mesh edge.

7. The touch screen of claim 1, wherein the color matching line between the adjacent first sensing pattern and second sensing pattern is disconnected from the node of the mesh where the first sensing pattern and the second sensing pattern are adjacent.

8. The touch screen claim 1, wherein the wire region comprises a plurality of wire clusters, the wire clusters are insulated to each other, each wire cluster is formed by single column mesh cells connected to each other, one end of each wire cluster is electrically connected to one of the second sensing pattern.

9. The touch screen of claim 8, wherein each wire cluster has two common nodes with the second sensing pattern.

10. The conductive layer of the touch screen of claim 8, wherein part of wire clusters comprise a trunk portion, adjacent mesh cells in the trunk portion are connected to each other by one common node.

11. The touch screen of claim 10, wherein the some wire clusters further comprise a branch portion connected to the trunk portion, adjacent mesh cells in the branch portion connect each other by one common mesh edge, the adjacent mesh cells comprises two common nodes, a mesh cell on one end of the branch portion connects to a mesh cell on one end of the trunk portion by a common mesh edge.

12. The touch screen of claim 10, wherein the color matching line between the trunk portion of the adjacent two wire clusters is disconnected from the middle of the mesh edge.

13. The touch screen of claim 6, wherein the disconnection has a length of 2-20 μm.

14. The touch screen of claim 13, wherein the disconnection has a length of 3-9 μm.

15. The touch screen of claim 10, wherein the trunk portion is disconnected from the node where the mesh is adjacent to the color matching line.

16. The touch screen of claim 9, wherein the adjacent mesh cells of the portion of the some wire clusters are connected to each other by a common mesh edge, the adjacent two mesh cells comprises two common nodes.

17. The touch screen of claim 1, wherein the mesh cell of the mesh is a diamond.

18. The touch screen of claim 1, wherein the sensing region comprises a left sensing region and a right sensing region, which are mutually separated, each left sensing region and right sensing region comprises a plurality of first sensing patterns and a plurality of second sensing patterns, the wire region is disposed between the left sensing region and the right sensing region.

19. The touch screen of claim 1, wherein the trench is formed by embossing of an embossing mold with a preset protrusion.

20. The touch screen of claim 19, wherein the trench has a depth-to-width ratio of more than 1.

21. The touch screen of claim 19, wherein the trench has a depth no less than the thickness of the conductive layer.

22. The touch screen of claim 1, wherein the thickness of the base material layer is less than that of the glass substrate.

23. The touch screen of claim 1, further comprising a protective layer, the protective layer covers the base material layer and the conductive layer.

* * * * *